(12) United States Patent
Shibuya et al.

(10) Patent No.: US 7,060,361 B2
(45) Date of Patent: Jun. 13, 2006

(54) SILICA-BASED ORGANIC FILM AND METHOD OF MANUFACTURING THE SAME, AND BASE MATERIAL COMPRISING ORGANIC FILM

(75) Inventors: Tatsuhiko Shibuya, Kawasaki (JP); Yasushi Fujii, Kawasaki (JP)

(73) Assignee: Tokyo Ohka Kogyo Co., Ltd. (JP)

( * ) Notice: Subject to any disclaimer, the term of this patent is extended or adjusted under 35 U.S.C. 154(b) by 0 days.

(21) Appl. No.: 10/616,731

(22) Filed: Jul. 10, 2003

(65) Prior Publication Data

US 2004/0028915 A1    Feb. 12, 2004

(30) Foreign Application Priority Data

Jul. 12, 2002  (JP) ............................. 2002-204625
May 29, 2003  (JP) ............................. 2003-152711

(51) Int. Cl.
B32B 9/04 (2006.01)
(52) U.S. Cl. .................. 428/447; 427/377; 427/387
(58) Field of Classification Search ............... 428/447; 427/377, 387
See application file for complete search history.

(56) References Cited

U.S. PATENT DOCUMENTS

| 5,840,821 | A | 11/1998 | Nakano et al. | |
|---|---|---|---|---|
| 6,074,962 | A | 6/2000 | Sakamoto et al. | |
| 6,140,150 | A * | 10/2000 | Efland et al. | 438/106 |
| 6,410,151 | B1 * | 6/2002 | Kurosawa et al. | 428/447 |
| 6,503,633 | B1 * | 1/2003 | Nishikawa et al. | 428/447 |
| 6,589,644 | B1 * | 7/2003 | Yamada et al. | 428/312.6 |
| 6,737,118 | B1 * | 5/2004 | Yamada et al. | 427/379 |

FOREIGN PATENT DOCUMENTS

| JP | 62-283736 | 1/1996 |
|---|---|---|
| JP | 2739902 | 4/1998 |
| JP | 09-120685 | 11/1998 |
| JP | 2000-077399 | 3/2000 |
| JP | 2000-77399 A | 3/2000 |
| JP | 2000-340651 | 12/2000 |
| JP | 2001-210633 | 8/2001 |
| JP | 3228714 | 11/2001 |
| JP | 2003-253206 | 10/2003 |
| KR | 266060 | 11/2000 |
| WO | WO 95/24639 | 9/1995 |

* cited by examiner

*Primary Examiner*—Margaret G. Moore
(74) *Attorney, Agent, or Firm*—Ban Bedi, Esq.; Dechert LLP

(57) ABSTRACT

A film is provided which can be applied to high-temperature processes and can fill microspaces between wirings without forming voids and prevent the occurrence of side etching, and also causes less degassing due to increase of an atmospheric temperature. A coating solution containing a reaction product which is obtained by hydrolyzing at least one first alkoxysilane compound selected from the group consisting of compounds represented by general formula (I) and compounds represented by general formula (II) in an organic solvent in the presence of an acid catalyst is applied on a target material to form a coating film, and then the coating film is baked in an atmosphere having an oxygen concentration of 1000 ppm or less to form a silica-based organic film. At least one second alkoxysilane compound selected from the group consisting of compounds represented by general formula (III) may be used in combination:

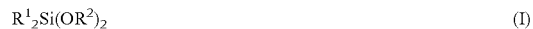

(I)

$R^1{}_2Si(OR^2)_2$  (I)

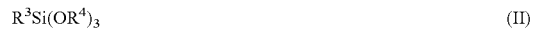

(II)

$R^3Si(OR^4)_3$  (II)

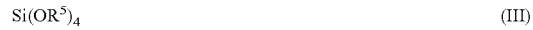

(III)

$Si(OR^5)_4$  (III)

wherein $R^1$ and $R^3$ each represents an alkyl group having 1 to 4 carbon atoms or a phenyl group, $R^2$, $R^4$, and $R^5$ each represents an alkyl group having 1 to 4 carbon atoms.

4 Claims, 2 Drawing Sheets

SILICA-BASED ORGANIC FILM AND METHOD OF MANUFACTURING THE SAME, AND BASE MATERIAL COMPRISING ORGANIC FILM

BACKGROUND OF THE INVENTION

1. Field of the Invention

The present invention relates to a silica-based organic film containing polyorganosiloxane and to a method of manufacturing the same, and to a base material comprising the silica-based organic film.

2. Description of Related Art

In the manufacture of base materials for semiconductor devices and liquid crystal devices, SOG (spin-on-glass) film has hitherto been known as a planarized film, a layer insulation film and a passivation film. "SOG" is generally used as a general term of a solution prepared by dissolving a silicon compound in an organic solvent (hereinafter occasionally referred to as a SOG solution) or as a film containing $SiO_2$ as a main component formed by applying the SOG solution and heating (hereinafter occasionally referred to as a SOG film).

Since a silica-based film formed by a chemical vapor deposition method (hereinafter occasionally referred to as a "CVD process") is conformable to a wiring pattern, it must be subjected to a reflow treatment at high temperature of about 950 to 1100° C. in order to planarize the surface after film formation. In contrast, the SOG film is excellent in surface smoothness because a film having a smooth surface can be formed by applying a coating solution and baking at a temperature lower than the temperature of the reflow treatment.

As the SOG film, for example, there have been known an organic SOG film comprising an organosiloxane unit having an R—Si group in which an organic group R such as a methyl group is bonded to a silicon atom (see, for example, Japanese Examined Patent Application, Second Publication No. Hei 8-3074) and an organic SOC film comprising a siloxane unit having no organic group and/or a siloxane unit having a H—Si group (see, for example, Japanese Patent No. 2739902 and Japanese Patent No. 3228714).

In the manufacture of base materials for semiconductor devices and liquid crystal devices, an SOG film is used as a layer insulation film provided on a wiring pattern, such as a wiring pattern made of aluminum, which is heat-resistant to a temperature of about 400 to 500° C. (hereinafter referred to as a "low-temperature process"), or an SOG film is used as a layer insulation film provided on a wiring pattern, such as a wiring pattern made of polycrystalline silicon, which is heat-resistant to a temperature of 600° C. or higher (hereinafter referred to as a "high-temperature process") (see Japanese Unexamined Patent Application, First Publication No. Hei 10-313002, Paragraph [0002] to [0007]).

A conventional organic SOG film has not been used in high-temperature processes because an organic group is decomposed when heated to a temperature of 600° C. or higher, and has been used only in low-temperature processes.

Inorganic SOG films described in Japanese Unexamined Patent Application, First Publication No. Sho 10-313002 and Japanese Patent No. 3228714 could be applied to both low-temperature processes and high-temperature processes.

However, as semiconductor devices have recently become finer, it becomes difficult to form an insulating film provided on an upper layer of a metal wiring pattern referred to as PMD using an organic SOG film in a device having a gate length of 0.18 μm or less. Specifically, the organic SOG film may cause not only a problem such as cracking during baking with heating, but also a problem such as so-called side etching wherein the organic SOG film constituting an inner wall of contact holes is etched in a horizontal direction to a substrate when contact holes piercing through the organic SOG film are formed and the inside of contact holes are cleaned with hydrofluoric acid. Such side etching may occur at the bottom of the organic SOG film, that is, the portion at the substrate side in a thickness direction of the film.

In particular, a substrate for next-generation devices includes the portion wherein a fine recess portion having a width (wiring distance) of 0.25 μm or less and a depth (step) of 0.4 μm or more is formed between wirings in the state of being coated with a film formed by the CVD process. It is required for the SOG film formed on the substrate to fill microspaces between wiring without forming voids. Since side etching occurs in the SOG film, which fills the recess portion between wirings to planarize it, thereby causing short circuiting between wirings, it becomes important to prevent the occurrence of side etching by reducing an etching rate of the SOC film using hydrofluoric acid.

The etching rate of a conventional organic SOC film using hydrofluoric acid was higher than 100 angstroms/min. The etching rate of the above organic SOC film was the same as that of the conventional organic SOG film.

BRIEF SUMMARY OF THE INVENTION

An object of the present invention is to provide a silica-based organic film which can be used as a SOG film applicable to high-temperature processes, and a method of manufacturing the same. Preferably, the present invention provides a method of manufacturing a silica-based organic film, which can reduce an etching rate using hydrofluoric acid in the silica-based organic film. Also, the present invention provides a silica-based organic film whose etching rate using hydrofluoric acid is reduced.

Another object of the present invention is to provide a base material comprising the film.

To attain the above objects, the method of manufacturing a silica-based organic film according to the present invention comprises the steps of: applying a coating solution on a target material to form a coating film, the coating solution containing a reaction product obtained by hydrolyzing, in an organic solvent in the presence of an acid catalyst, at least one first alkoxysilane compound selected from the group consisting of compounds represented by general formula (I):

$$R^1{}_2Si(OR^2)_2 \qquad (I)$$

wherein $R^1$ represents an alkyl group having 1 to 4 carbon atoms or a phenyl group, and $R^2$ represents an alkyl group having 1 to 4 carbon atoms, and compounds represented by general formula (II):

$$R^3Si(OR^4)_3 \qquad (II)$$

wherein $R^3$ represents an alkyl group having 1 to 4 carbon atoms or a phenyl group, and $R^4$ represents an alkyl group having 1 to 4 carbon atoms, and baking the coating film in an atmosphere having an oxygen concentration of 1000 ppm or less to form a film.

As used herein, the term "ppm" is by weight unless otherwise specified.

Also the above objects can be solved by a method of manufacturing a silica-based organic film, comprising the steps of:

applying a coating solution on a target material to form a coating film, the coating solution containing a reaction product obtained by hydrolyzing, in an organic solvent in the presence of an acid catalyst, at least one first alkoxysilane compound selected from the group consisting of compounds represented by general formula (I):

$$R^1_2Si(OR^2)_2 \qquad (I)$$

wherein $R^1$ represents an alkyl group having 1 to 4 carbon atoms or a phenyl group, and $R^2$ represents an alkyl group having 1 to 4 carbon atoms, and compounds represented by general formula (II):

$$R^3Si(OR^4)_3 \qquad (II)$$

wherein $R^3$ represents an alkyl group having 1 to 4 carbon atoms or a phenyl group, and $R^4$ represents an alkyl group having 1 to 4 carbon atoms, and at least one second alkoxysilane compound selected from the group consisting of compounds represented by general formula (III):

$$Si(OR^5)_4 \qquad (III)$$

wherein $R^5$ represents an alkyl group having 1 to 4 carbon atoms, and baking the coating film in an atmosphere having an oxygen concentration of 1000 ppm or less to form a film.

To attain the above objects, the silica-based organic film of the present invention contains polyorganosiloxane, wherein an etching rate of the film in wet etching using hydrofluoric acid having a concentration of 0.5% by weight is 60 angstroms/min or less.

To attain the above objects, the base material of the present invention comprises a substrate and a first wiring pattern which is heat-resistant to a temperature of 600° C. or higher provided on the substrate, the first wiring pattern being coated with the silica-based organic film of the present invention.

According to the method of manufacturing a silica-based organic film of the present invention, it is possible to obtain a silica-based organic film which can be applied to high-temperature processes. The silica-based organic film is excellent in filling properties and surface smoothness and also can reduce the occurrence of degassing. Furthermore, the occurrence of side etching can be prevented by improving the resistance to hydrofluoric acid.

The silica-based organic film of the present invention is particularly suited for use as a planarized film which covers a fine wiring pattern formed on a substrate, and also can be applied to low-temperature processes and high-temperature processes, to which a conventional organic SOG film has never been applied. Therefore, according to the present invention, it is possible to obtain a base material comprising a substrate and a first wiring pattern which is heat-resistant to a temperature of 600° C. or higher provided on the substrate, the first wiring pattern being coated with the silica-based organic film of the present invention.

DETAILED DESCRIPTION OF THE INVENTION

Figure 1:
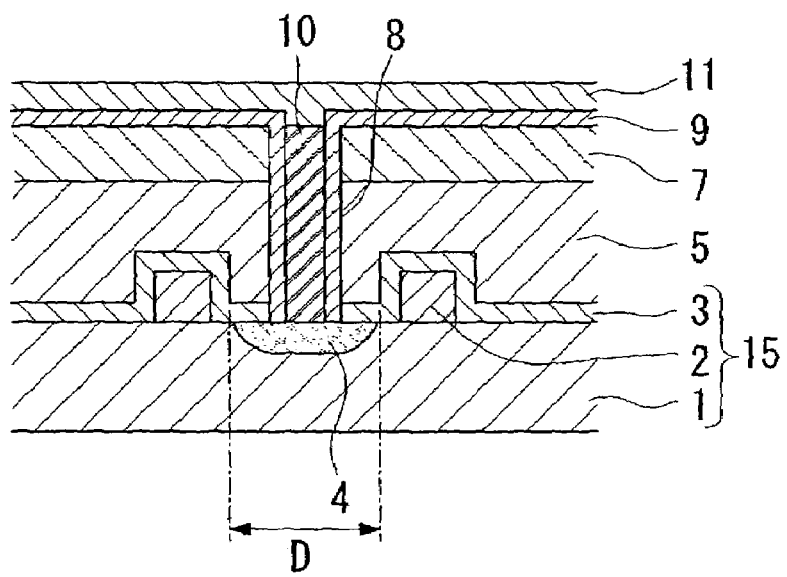
FIG. 1 is a sectional view showing a main portion of a base material according to an embodiment of the present invention.

FIG. 1 is a sectional view showing a main portion of a base material according to an embodiment of the present invention and shows a multi-layer structure which constitutes a portion of a semiconductor device. In the present embodiment, a first wiring pattern 2 made of polycrystalline silicon (which is heat-resistant to a temperature of 600° C. or higher) is formed on a substrate 1 made of silicon and an intermediate layer 3 made of silicon nitride (SiN) is formed on the first wiring pattern 2 and, furthermore, a silica-based organic film 5 of the present invention is formed thereon. The intermediate layer 3 is formed by the CVD process.

In the present embodiment, a laminate comprising the substrate 1, the first wiring pattern 2 and the intermediate layer 3 is a target material 15.

In the present embodiment, an impurity diffusion layer 4 is formed in the substrate. On the silica-based organic film 5, a P-TEOS film ($SiO_2$ film formed by the reaction between tetraethyloxirane and oxygen using the plasma CVD process) 7 is laminated and contact holes 8 piercing through the P-TEOS film 7 and the silica-based organic film 5 to reach the impurity diffusion layer 4 of the substrate 1 is formed. A TiN film 9 is formed to cover the inner wall of contact holes 8 and top surface of the P-TEOS film 7, while contact holes 8 are filled with tungsten as a conductive material to form a W-plug 10, on which a second wiring pattern 11 made of aluminum (which is heat-resistant to a temperature of 400 to 500° C.) is formed.

The silica-based organic film 5 can be formed in the following manner.

Preparation of Coating Solution

First, the following coating solution (1) or coating solution (2) is prepared.

Coating solution (1): a coating solution containing a reaction product obtained by hydrolyzing, in an organic solvent in the presence of an acid catalyst, at least one first alkoxysilane compound selected from the group consisting of compounds represented by general formula (I):

$$R^1_2Si(OR^2)_2 \qquad (I)$$

wherein $R^1$ represents an alkyl group having 1 to 4 carbon atoms or a phenyl group, and $R^2$ represents an alkyl group having 1 to 4 carbon atoms, and compounds represented by general formula (II):

$$R^3Si(OR^4)_3 \qquad (II)$$

wherein $R^3$ represents an alkyl group having 1 to 4 carbon atoms or a phenyl group, and $R^4$ represents an alkyl group having 1 to 4 carbon atoms.

Coating solution (2): a coating solution containing a reaction product obtained by hydrolyzing, in an organic solvent in the presence of an acid catalyst, at least one first alkoxysilane compound selected from the group consisting of compounds represented by general formula (I):

$$R^1_2Si(OR^2)_2 \quad (I)$$

wherein $R^1$ represents an alkyl group having 1 to 4 carbon atoms or a phenyl group, and $R^2$ represents an alkyl group having 1 to 4 carbon atoms, and compounds represented by general formula (II):

$$R^3Si(OR^4)_3 \quad (II)$$

wherein $R^3$ represents an alkyl group having 1 to 4 carbon atoms or a phenyl group, and $R^4$ represents an alkyl group having 1 to 4 carbon atoms, and at least one second alkoxysilane compound selected from the group consisting of compounds represented by general formula (III):

$$Si(OR^5)_4 \quad (III)$$

wherein $R^5$ represents an alkyl group having 1 to 4 carbon atoms.

The composition of the alkoxysilane compound used in the preparation of the coating solution is set so that the carbon content in the silica-based organic film 5 obtained after the baking step is within a range from 6 to 18 atm %, and preferably from 10 to 14 atm %.

A value of the carbon content in the silica-based organic film in the present specification is a value calculated by the following formula (1) and is decided by the raw material composition.

As the carbon content in the silica-based organic film decreases, cracking is liable to occur and the rate of etching using hydrofluoric acid increases. When the carbon content is too high, adhesion between adjacent upper and lower layers may be reduced. It is preferable to set the carbon content to within the above range for the following reasons. That is, cracking hardly occurs, and it is possible to fill fine recess portions without forming voids, and adhesion between adjacent upper and lower layers and workability during dry etching are excellent and damage during $O_2$ ashing is suppressed.

$$\frac{12\times [2x(\text{number of carbons of } R^1) + y(\text{number of carbons of } R^3)]}{xM_1 + yM_2 + zM_3} \times 100 \quad (1)$$

$M_1$: Molecular weight of $R^1_2SiO_{2/2}$
$M_2$: Molecular weight of $R^3SiO_{3/2}$
$M_3$: Molecular weight of $SiO_2$ In the formula (1), x, y and z respectively correspond to molar ratios of compounds represented by the general formulas (I), (II) and (III) during charging.

$R^1_2SiO_{2/2}$ is a siloxane unit formed of an alkoxysilane compound represented by the general formula (I).

Similarly, $R^3SiO_{3/2}$ is a siloxane unit formed of an alkoxysilane compound represented by the general formula (II) and $SiO_2$ is a siloxane unit formed of an alkoxysilane compound represented by the general formula (III).

To prepare a coating solution (1), first, the first alkoxysilane compound is dissolved in an organic solvent to obtain an alkoxysilane compound solution.

Preferable examples of the compounds represented by general formula (I) include dialkyldialkoxysilane such as dimethyldimethoxysilane, dimethyldiethoxysilane, dimethyldipropoxysilane, diethyldimethoxysilane, diethyldiethoxysilane, diethyldipropoxysilane, dipropyldimethoxysilane, dipropyldiethoxysilane or dipropyldipropoxysilane; and diphenyldialkoxysilane such as diphenyldimethoxysilane or diphenyldiethoxysilane. Among these compounds, dialkyldialkoxysilane is more preferable.

In particular, the compound wherein $R^1$ is a methyl group is more preferable because it is inexpensive and easily available and also the resulting film has high denseness.

Preferable examples of the compounds represented by the following general formula (II) include monoalkyltrialkoxysilane such as monomethyltrimethoxysilane, monomethyltriethoxysilane, monomethyltripropoxysilane, monoethyltrimethoxysilane, monoethyltriethoxysilane, monoethyltripropoxysilane, monopropyltrimethoxysilane or monopropyltriethoxysilane; and monophenyltrialkoxysilane such as monophenyltrimethoxysilane or monophenyltriethoxysilane, and monoalkyltrialkoxysilane is more preferable.

In particular, the compound wherein $R^3$ is a methyl group is more preferable because it is inexpensive and easily available and also the resulting film has high denseness.

In the preparation of the coating solution (1), one, two or more kinds of first alkoxysilane compounds can be appropriately selected so that the carbon content in the silica-based organic film is within a range from 6 to 18 atm % as long as the silica-based organic film can be formed.

It is more preferable to use only the compound represented by the general formula (II) because a ladder type reaction product (hydrolysis condensate) is easily obtained by the hydrolysis treatment step described hereinafter and the ladder type reaction product forms a dense film. In this case, when using only monomethyltriethoxysilane, the carbon content in the silica-based organic film thus formed is 17.9 atm % as a result of calculation by the following formula.

$$C/[(CH_3)SiO_{3/2}]\times 100$$

In the formula for calculation of the carbon content, "C" is abbreviation of "molecular weight of C", and "$(CH_3)SiO_{3/2}$" is abbreviation of "molecular weight of $(CH_3)SiO_{3/2}$" (hereinafter similar abbreviations are used).

A coating solution (2) is prepared by a method of mixing the first alkoxysilane compound with the second alkoxysilane compound and hydrolyzing the resulting mixture, or a method of separately hydrolyzing the first alkoxysilane compound and the second alkoxysilane compound and mixing the resulting hydrolyzate. Although any method may be used in the present invention, the former method of hydrolyzing after mixing is preferable because it is highly efficient due to less manufacturing processes and the resulting silica-based organic film has high uniformity. In the present specification, the method hydrolyzing after mixing will be described.

First, the first alkoxysilane compound and the second alkoxysilane compound are dissolved in an organic solvent to obtain an alkoxysilane compound solution. The first alkoxysilane compound and the second alkoxysilane compound may be dissolved in the organic solvent after being previously mixed to form a mixture, or may be separately charged and mixed in the organic solvent.

Preferable examples of the compounds represented by the general formula (III) include tetraalkoxysilane such as tetramethoxysilane, tetraethoxysilane, tetrapropoxysilane or tetrabutoxysilane.

As described above, when using in combination with the compound represented by the general formula (III), it is easy to control the carbon content in the silica-based organic film, thereby making it possible to prevent the occurrence of cracking and to effectively reduce the rate of etching using hydrofluoric acid. In this respect, the coating solution (2) is preferable as compared with the coating solution (1).

Practically preferable combination of alkoxysilane compound used in the preparation of the coating solution (2) is a combination of one, or two or more kinds selected from among monomethyltrimethoxysilane, monomethyltriethoxysilane, dimethyldimethoxysilane and dimethyldiethoxysilane, and tetramethoxysilane and/or tetraethoxysilane.

Even if the amount of the second alkoxysilane compound is too large or small relative to the amount of the alkoxysilane compound in the preparation of the coating solution (2), the carbon content in the silica-based organic film exceeds a proper range. Therefore, a molar ratio of the first alkoxysilane compound to the second alkoxysilane compound used in the preparation of the coating solution (2) (first alkoxysilane compound:second alkoxysilane compound) is preferably within a range from 1:2 to 4:1, and more preferably from 1:1 to 3:1.

In the preparation of the coating solution (2), it is preferable to use two kinds, for example, the compound represented by the general formula (III) and the compound represented by the general formula (II), or three kinds, for example, the compound represented by the general formula (III), the compound represented by the general formula (I) and the compound represented by the general formula (II).

It is particularly preferable that only the compound represented by the general formula (II) be used as the first alkoxysilane compound and be used in combination with the second alkoxysilane compound (compound represented by the general formula (III)) in a molar ratio within the above range.

The following description is for the coating solutions (1), and (2).

As the organic solvent, conventionally used organic solvents can be used. Specific examples thereof include monohydric alcohols such as methyl alcohol, ethyl alcohol, propyl alcohol or butyl alcohol; alkyl carboxylate esters such as methyl-3-methoxypropionate or ethyl-3-ethoxypropionate; polyhydric alcohols such as ethylene glycol, diethylene glycol or propylene glycol; polyhydric alcohol derivatives such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, ethylene glycol monomethyl ether acetate, ethylene glycol monoethyl ether acetate, propylene glycol monomethyl ether acetate or propylene glycolmonoethyl ether acetate; fatty acids such as acetic acid or propionic acid; and ketones such as acetone, methyl ethyl ketone or 2-heptanone. These organic solvents may be used alone, or two or more kinds thereof may be used in combination.

Among these organic solvents, when using monohydric alcohols, ketones, glycol-based polyhydric alcohols, polyhydric alcohol derivatives and alkoxy carboxylate esters, good coating properties can be obtained.

The amount of the organic solvent used is preferably from 10 to 30 mol per 1 mol of the alkoxysilane compound used in the preparation of the coating solution.

The alkoxysilane compound solution can appropriately contain optional components, for example, surfactants for improving coating properties, and acids for accelerating dehydration condensation during baking.

The resulting alkoxysilane compound solution is hydrolyzed by adding an acid catalyst and water, followed by dehydration condensation of the resulting silanol to obtain a coating solution containing a reaction product. Water and the acid catalyst may be separately added to the alkoxysilane compound solution, or an aqueous acid catalyst solution obtained by mixing a part or all of water and the acid catalyst may be added.

In the hydrolysis treatment, the alkoxysilane compound in the solution may be completely or partially hydrolyzed. The degree of the hydrolysis, namely, the hydrolysis degree, can be controlled by the amount of water.

When the amount of water is too small, the hydrolysis degree decreases and degassing unfavorably increases during formation of the film. When the amount of water is too large, gelation is liable to occur and the storage stability unfavorably deteriorates. Therefore, water is preferably added in an amount of 2 to 10 mol, and more preferably 6 to 9 mol, per 1 mol of the total amount of the alkoxysilane compound used in the preparation of the coating solution, for example, per 1 mol of the first alkoxysilane compound in the case of the coating solution (1) or per 1 mol of the total amount of the first and second alkoxysilane compounds in the case of the coating solution (2).

As the acid catalyst, conventionally used organic and inorganic acids can be used. Specific examples of the organic acid include acetic acid, propionic acid, and butyric acid. Specific examples of the inorganic acid include hydrochloric acid, nitric acid, sulfuric acid, and phosphoric acid.

The amount of the acid catalyst is preferably set so that the concentration of the acid in the alkoxysilane compound solution after the addition is within a range from 1 to 1000 ppm, and preferably from 5 to 500 ppm.

It is preferable to gradually added the acid catalyst and water while stirring the compound solution and, after the addition, the hydrolysis reaction proceeds by standing. Although the hydrolysis reaction requires a reaction time of about 5 to 100 hours, the reaction time can be reduced when the reaction is conducted by adding dropwise an aqueous acid catalyst solution while heating the alkoxysilane compound solution to a temperature lower than 80° C.

When the alkoxysilane compound is hydrolyzed in the presence of the acid catalyst, an alkoxy group is converted into a silanol group and, at the same time, the silanol group causes intermolecular dehydration condensation to form a siloxane bond wherein an organic group is bonded to a silicon atom. Such a siloxane bond has a film-forming ability. The reaction product obtained by hydrolyzing the alkoxysilane compound in an organic solvent in the presence of the acid catalyst mainly contains a siloxane oligomer having a polymerization degree of about 2 to 20. The weight-average molecular weight of the siloxane oligomer obtained by hydrolyzing the alkoxysilane compound is preferably within a range from 1000 to 4000, and more preferably from 1500 to 3000. When the weight-average molecular weight of the reaction product is within a range from 1000 to 4000, the surface of the film becomes very smooth. When the weight-average molecular weight is higher than the above range, gelation is liable to occur. On the other hand, when the weight-average molecular weight is lower than the above range, the film-forming ability is poor. The weight-average molecular weight of the siloxane oligomer obtained by hydrolyzing the alkoxysilane compound can be controlled by the amount of water used in the hydrolysis reaction, reaction time, and reaction temperature.

The coating solution thus obtained can be used after appropriately diluting with an organic solvent taking into account the film thickness of the film to be formed. The organic solvent used for dilution includes the same organic solvents used in the alkoxysilane compound solution. Although the solid content of the coating solution is not specifically limited, when the solid content is too high, it becomes difficult to prepare the coating solution. On the other hand, when the solid content is too low, a desired film thickness cannot be obtained. Therefore, it is preferable to appropriately set it within a range from about 2 to 25% by weight calculated on the basis of $SiO_2$ according to the surface shape of the surface to be coated, the application method and the thickness of the film to be formed.

In the coating solution, the water content with respect to the amount of the entire solvent excluding the solid content is preferably from 1 to 30% by weight, and more preferably from 5 to 15% by weight. When the water content in the coating solution is within the above range, the resistance to wet etching using hydrofluoric acid can be improved.

The method of controlling the water content in the coating solution is not specifically limited, but includes a method of adding water in excess as compared with the amount required to the hydrolysis reaction in the case of hydrolyzing by adding water to the alkoxysilane compound solution, and controlling the reaction time so that a preferable amount of water remains in the coating solution after the completion of the reaction, thereby completing the hydrolysis reaction.

Alternatively, the water content in the coating solution can be controlled within the above preferable range by the method of removing water from the solution after the completion of the hydrolysis reaction of the alkoxysilane compound, and adding water again.

Alternatively, the water content in the coating solution can be controlled within the above preferable range by the method of adding water to the solution after the completion of the hydrolysis reaction of the alkoxysilane compound.

The water content in the coating solution, namely, the water content with respect to the amount of the solvent excluding the solid content of the coating solution, can be measured by gas chromatography.

Formation of Silica-Based Organic Film

The coating solution thus prepared is applied on a target material 15 to form a coating film, and then the coating film is baked, thereby causing the dehydration condensation reaction in the film to form polyorganosiloxane, thus obtaining a silica-based organic film 5.

As the method of applying the coating solution on the target material 15, for example, known methods such as spinner method, roll coater method, dip-draw method, spraying method, screen printing method and brushing method can be used.

Although the coating film formed on the target material 15 can be immediately baked, a portion of the organic solvent contained in the coating film is preferably removed because uniformity of the surface of the coating film is improved.

The drying temperature may be a temperature higher than a boiling point of the organic solvent contained in the coating film, and is preferably 220° C. or lower because the surface becomes non-uniform when the temperature is too high.

More preferably, the coating film is dried in three steps of a first drying step of heating at 50 to 100° C., preferably 70 to 90° C. for 30 to 90 seconds, preferably 50 to 70 seconds, a second drying step of heating at 130 to 170° C., preferably 140 to 160° C. for 30 to 90 seconds, preferably 50 to 70 seconds after the first drying step, and a third drying step of drying at 190 to 220° C., preferably 190 to 210° C., 30 to 90 seconds, preferably 50 to 70 seconds after the first drying step. By performing the drying step in three steps, the uniformity of the surface of the coating film can be further improved.

The coating film is dried in an atmosphere wherein the oxygen concentration is 1000 ppm or less, preferably from 100 to 1000 ppm, and more preferably from 100 to 500 ppm.

In the coating film, an organic group bonded to a silicon atom exists and the organic group is decomposed at about 600° C. when heated in an atmosphere wherein the oxygen concentration exceeds 1000 ppm. However, by heating in an atmosphere wherein the oxygen concentration is reduced, a film can be formed by suppressing the decomposition of the organic group even when baked at a temperature of higher than 600° C. Surprisingly, by baking in the state wherein the oxygen concentration is reduced, the resistance to hydrofluoric acid of the resulting silica-based organic film 5 is improved and degassing caused by atmospheric temperature increase can be suppressed even if the baking temperature is the same as in the case of baking in an air. Consequently, it is made possible to suppress phenomena such as film shrinkage due to vaporization of a gas, occurrence of cracking accompanying with film shrinkage, and poor adhesion between the silica-based organic film 5 and a film provided thereon.

baking conditions are preferably set so that the organic solvent in the coating film is removed by heating and the dehydration condensation reaction is accelerated to obtain a film of organosiloxane. baking conditions are more preferably set so that an organic group content in the film becomes 0.01 or more after baking. The organic group content in the film after baking can vary depending on the baking temperature, the baking time, and the oxygen concentration in the atmosphere.

The baking temperature is preferably set within a range from 600 to 750° C., more preferably from 650 to 750° C., and still more preferably from 680 to 720° C.

The baking time is preferably set within a range from 10 to 60 minutes, and more preferably from 20 to 40 minutes.

As the temperature during baking becomes higher, the denseness of the film increases and the resistance to hydrofluoric acid of the resulting silica-based organic film 5 is improved and, furthermore, degassing due to atmospheric temperature increase is suppressed. When the baking temperature exceeds 750° C., the organic group is liable to be decomposed even when baked in the atmosphere wherein the oxygen concentration is reduced to 1000 ppm or less. When the organic group in the film is decomposed, a silica-based organic film cannot be obtained and, therefore, the upper limit of the baking temperature is about 750° C.

As the method of reducing the oxygen concentration in the atmosphere during baking, a method of sufficiently replacing an air by an inert gas can be used. The inert gas is preferably a nitrogen gas. Since the oxygen concentration in the atmosphere must be reduced before the temperature of the film reaches the decomposition temperature of the organic group, it is preferable to replace the air by the inert gas within a temperature range where the organic group is not decomposed and to raise the temperature to the baking temperature.

As the oxygen concentration of the atmosphere during baking decreases, the amount of the organic group decomposed during baking is reduced. The oxygen concentration may be 0 ppm, but is not preferable economically so as to attain the level.

As described above, after forming the silica-based organic film 5 on the target material 15, formation of a P-TEOS film 7, formation of contact holes 8, cleaning the inside of the contact holes 8, formation of a TiN film 9, formation of a W-plug 10 and formation of a second wiring pattern 11 are performed in turn to obtain a base material having a structure shown in FIG. 1.

In the cleaning of the inside of the contact holes 9, hydrofluoric acid having a concentration of about 0.1 to 0.5% by weight is generally used.

Silica-Based Organic Film

As described above, a silica-based organic film 5 made of polyorganosiloxane can be obtained by baking under specific oxygen concentration while suppressing the decomposition of the organic group. The organic group content in the silica-based organic film 5 is preferably 0.01 or more, and more preferably 0.02 or more.

Figure 2:
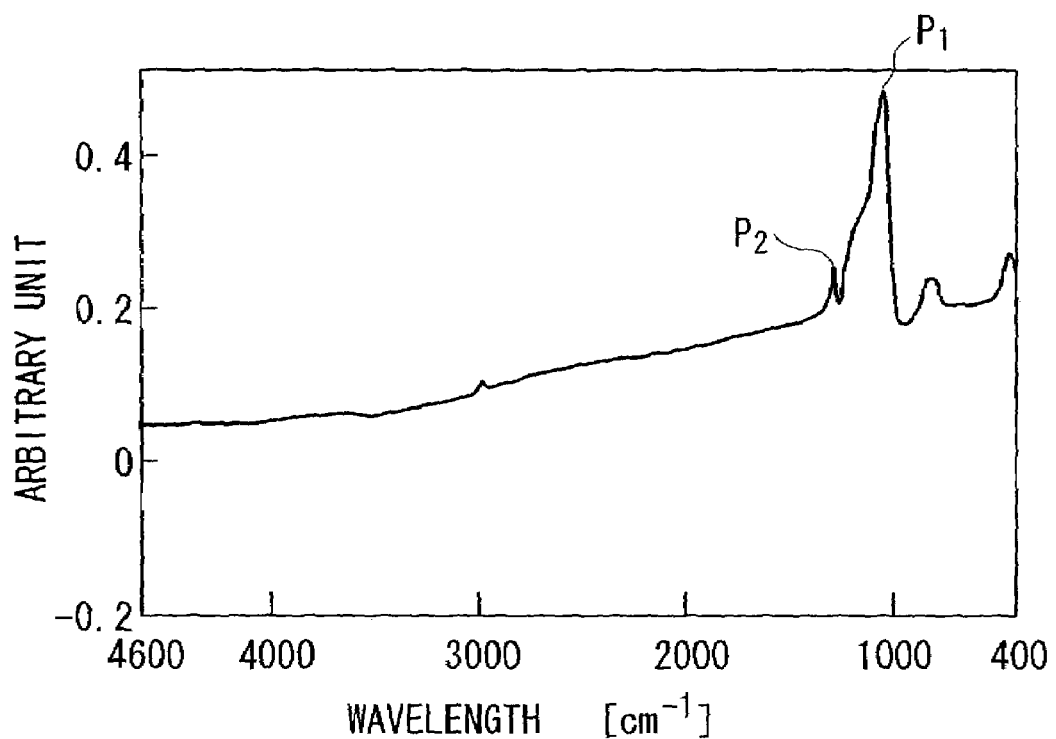
FIG. 2 is a graph showing an example of an infrared absorption spectrum of a silica-based organic film of the present invention.

FIG. 2 shows an example of an infrared absorption spectrum of the silica-based organic film 5.

As shown in FIG. 2, the organic group content of the silica-based organic film as used herein refers to a value obtained by calculating a ratio (B/A) of the total of a peak area of $SiR_1$ and a peak area of $SiR^3$ (an area B of peak $P_2$ corresponding to $SiCH_3$ in the example of FIG. 2) to a peak area corresponding to Si—O—Si (an area A of peak $P_1$ in the example of FIG. 2) in a spectrum obtained by measuring the infrared absorption spectrum of the silica-based organic film. For example, the peak corresponding to Si—O—Si is obtained at about 1050 $cm^{-1}$, while the peak corresponding to $SiCH_3$ is obtained at about 1250 $cm^{-1}$.

Since the organic group content in the silica-based organic film 5 varies depending not only the composition of the alkoxysilane compound used in the preparation of the coating solution, but also baking conditions, for example, the amount of the organic group decomposed during baking, it can be controlled by the raw material composition and baking conditions.

When the organic group content of the silica-based organic film 5 is less than 0.01, the effect of preventing side etching becomes insufficient and the same problem as that of the organic SOG film, such as cracking during baking with heating, is liable to arise. As the value of the organic group content of the silica-based organic film 5 increases, the hydrophobicity of the surface of the film is enhanced and the resistance to hydrofluoric acid is enhanced. Also a shrinkage ratio of the film decreases when the film is converted into a film during baking and stress during formation of the film decreases. The organic group content of the silica-based organic film 5 tends to decrease as the baking temperature raises and the upper limit of the organic group content of the silica-based organic film 5 is about 0.038 at 700° C. and about 0.041 at 600° C.

The silica-based organic film 5 of the present embodiment has excellent resistance to hydrofluoric acid and, therefore, the occurrence of side etching is prevented when the inside of contact holes 9 is cleaned with a fluorine-containing solution.

In the film obtained by a conventional method of producing an organic SOG film, for example, a method of baking in an air, the etching rate in wet etching using hydrofluoric acid having a concentration of 0.5% by weight was higher than about 100 angstroms/min. According to the present invention, the etching rate can be reduced and it is made possible to obtain a silica-based organic film 5 having the etching rate of preferably 100 angstroms/min or less, and more preferably 60 angstroms/min (6 nm/min) or less. When the etching rate is 60 angstroms/min or less, side etching can be effectively prevented. The etching rate of the silica-based organic film 5 is preferably from 10 to 50 angstroms/min.

The wet etching using hydrofluoric acid having a concentration of 0.5% by weight in the present invention is conducted at 25° C. Since the etching rate in the wet etching tends to drastically vary depending on the surface of the film of the silica-based organic film and the vicinity of the substrate of the film, the etching rate in the inside of the film is employed in the present invention so as to obtain conditions closest to those of side etching in the contact holes.

For example, the etching rate is calculated in the following manner. First, a film having a film thickness of 4000 angstroms is provided, and then the resulting film is dipped in hydrofluoric acid having the above concentration and the etching rate is measured. The etching rate (unit: angstroms/min) can be determined by the following formula for calculation:

$$(X1-X2)/T$$

where T denotes a time T (minutes) required from changing from the state of the film thickness X1 (angstroms) into the state of the film thickness X2 (angstroms) as a result of a decrease in film thickness.

In the present specification, the etching rate in the inside of the film is employed and the etching rate in a portion or all range from the film thickness of 3000 angstroms to the film thickness of 1500 angstroms is measured. In the above formula for calculation, X1 denotes a value of 3000 angstroms or less, X2 denotes a value of 1500 angstroms or more, and X1>X2.

As the organic group content in the silica-based organic film 5 increases, the hydrophobicity of the surface of the film is enhanced and the etching rate decreases. As described above, as the baking temperature raises, the organic group content of the silica-based organic film 5 tends to decrease. With respect to the resistance to hydrofluoric acid, an influence of the baking temperature is larger than that of the organic group content. Therefore, the lower limit of the etching rate is about 15 angstroms/min at the baking temperature of 700° C. and is about 40 angstroms/min at 600° C. Therefore, the baking temperature is more preferably about 700° C. (680° C. to 720° C.).

The silica-based organic film 5 of the present embodiment can be used in high-temperature processes wherein the heating temperature is up to 750° C. because, if the oxygen concentration is reduced to 1000 ppm or less, the decomposition of the organic group is suppressed even when exposed to high temperature of about 750° C. and deterioration of film characteristics is suppressed.

According to the method of producing the silica-based organic film 5 of the present embodiment, since a coating solution is applied on a target material 15 to form a coating film and the coating film is baked to form a film, it is made possible to fill fine unevenness on the target material 15, if any, without forming voids and also the smoothness of the surface of the coating film is excellent.

Therefore, according to the method of the present embodiment, it is possible to fill microspaces with a fine film without forming voids even in the case of a wiring pattern wherein a distance between adjacent wiring patterns in the state of being coated with an intermediate layer (the distance is indicated by the symbol D in FIG. 1) is about 0.25 μm, thereby yielding a silica-based organic film 5 which excellent in filling properties and surface smoothness.

Also, according to the method of the present embodiment, the decomposition of the organic group due to baking can be suppressed and, furthermore, it is made possible to form a silica-based organic film which has the same organic group as in the case of a conventional organic SOG film and has high denseness even in the case of a high-temperature process. Therefore, it is made possible to obtain a silica-based organic film 5 which is excellent in hydrofluoric acid resistance and degassing characteristics as compared with a conventional organic SOG film.

Therefore, the silica-based organic film 5 of the present embodiment can be preferably used in high-temperature processes, to which a conventional organic SOG film has never been applied, and can also prevent short circuiting between wirings which has never been solved by a conventional organic SOG film, and thus it is possible to cope with reduction in space between wirings.

The constitution of the base material is not limited to those shown in FIG. 1.

The substrate 1 is not specifically limited as long as it has sufficient heat resistance to endure the baking temperature for forming a silica-based organic film 5 and, for example, a semiconductor substrate such as a silicon substrate, metal substrate and ceramic substrate can be used.

The material constituting the first wiring pattern 2 is not specifically limited as long as it has sufficient heat resistance to endure the baking temperature for forming a silica-based organic film 5 and, for example, a material which is heat-resistant to a temperature of 600° C. or higher is preferably used. Specific examples thereof include polycrystalline silicon.

The silica-based organic film of the present invention is preferably used on a substrate 1 wherein a minimum value of a wiring distance D in a first wiring pattern 2 formed on a substrate is 0.25 μm or less, and more preferably within a range from 0.05 to 0.25 μm. The wiring distance in the wiring pattern as used herein refers to a distance in the state immediately before a silica-based organic film is formed, or a state of being coated with an intermediate layer 3 in the example of FIG. 1.

Layers other than the substrate 1 and the first wiring pattern 2 can be optionally provided in the present invention. In the case in which an intermediate layer 3 is provided on a first wiring pattern 2 by the CVD process, the surface of the intermediate layer 3 is not smoothened, and a silica-based organic film 5 is preferably used as a planarized film or a layer insulation film provided as the upper layer as compared with the intermediate layer 3.

The material constituting the intermediate layer 3 is not specifically limited as long as it has sufficient heat resistance to endure the baking temperature for forming a silica-based organic film 5 and, for example, a material which is heat-resistant to a temperature of 600° C. or higher is preferably used. Specific examples thereof include silicon nitride.

The constitution in the inside of contact holes 8 is not specifically limited. As shown in FIG. 1, the contact holes 8 may be filled with a conductive material.

As the conductive material filled in the contact holes 8, for example, tungsten can be used.

Since the silica-based organic film 5 is excellent in filling properties and surface smoothness, the silica-based organic film 5 is preferably provided between a first wiring pattern 2 and a second wiring pattern 11 in a base material wherein the second wiring pattern 11 is provided as the upper layer as compared with the first wiring pattern 2. Consequently, unevenness due to the first wiring pattern 2 is filled without forming voids and the second wiring pattern 11 can be formed on the smooth surface, and thus wire breakage in the second wiring pattern 11 is prevented.

The material constituting the second wiring pattern 11 is not specifically limited as long as it is heat-resistant to a temperature of 400 to 500° C. In general, the upper portion from the second wiring pattern 11 (opposite side of the substrate) is formed by a low-temperature process. As the second wiring pattern 11, for example, a metallic material such as aluminum is preferably used.

Like the example shown in FIG. 1, the silica-based organic film of the present invention is particularly suited for use as a planarized film for covering a fine wiring pattern formed on a substrate, but is not limited to the planarized film and can also be used to form a layer insulation film and a passivation film.

EXAMPLES

Example 1

90.67 g (0.67 mol) of monomethyltrimethoxysilane and 50.67 g (0.33 mol) of tetramethoxysilane were dissolved in an organic solvent mixture of 46.22 g of acetone and 92.43 g of isopropyl alcohol to obtain an alkoxysilane compound solution. To the resulting solution, 120.0 g (6.7 mol) of pure water and 50.0 μl of nitric acid were added and, after stirring, the mixture was aged by standing at room temperature for 4 days to obtain a coating solution. As a result, an organosiloxane oligomer was formed as a solid in the coating and the organosiloxane oligomer had a weight-average molecular weight of 1500. The coating solution had a solid content calculated on the basis of $SiO_2$ 15% by weight.

The resulting coating solution was diluted to a proper concentration for control of a film thickness. The water content measured by gas chromatography with respect to the amount of the solvent excluding the solid content of the coating solution was 11% by weight. The coating solution was then applied on a target material 15 with the constitution shown in FIG. 1 using a spinner method to form a coating film. A substrate 1 constituting the target material 15 was a silicon substrate and a wiring distance D of a first wiring pattern 2 made of polycrystalline silicon was 0.20 μm. The coating solution was applied under the conditions of a revolving speed of 2500 rpm and a thickness of the coating film on a bare wafer of 4400 angstroms.

The coating film thus formed was dried at 80° C. for one minute, dried at 150° C. for one minute, and then dried at 200° C. for one minute.

To bake the coating film on the target material 15, a nitrogen gas was supplied in a heating furnace at a flow rate of 5 l/min and the atmosphere in the heating furnace was replaced. After the oxygen concentration in the heating furnace reached 1000 ppm, the target material 15 provided with the coating film formed therein was put in the heating furnace. After heating to 700° C., the material was baked at 700° C. for 30 minutes while supplying a nitrogen gas to form a silica-based organic film 5.

By the silica-based organic film 5 thus formed, unevenness wherein the wiring distance D in an intermediate layer (SiN film) 3 is 0.20 μm was filled and no cracking occurred in the silica-based organic film 5 and the surface was smooth. Also in the case in which the wiring distance D is 0.05 μm, neither voids nor cracking occurred and the surface was smooth.

The carbon content in the resulting silica-based organic film 5 was calculated by the following formula (2) and the value was 12.4 atm %.

$$[2C/\{2(CH_3SiO_{3/2})+SiO_2\}]\times 100 \qquad (2)$$

FIG. 2 is a graph showing an infrared absorption spectrum of the silica-based organic film 5 obtained after curing.

The organic group content of the silica-based organic film 5 obtained in the present example was calculated from the infrared absorption spectrum. As a result, it was 0.032.

In the same manner as described above, a silica-based organic film was formed on a bare wafer in a film thickness of 4000 angstroms and wet etching was conducted by dipping in hydrofluoric acid having a concentration of 0.5% by weight at 25° C. for 150 minutes. The etching rate at a film thickness of 3400 to 1200 angstroms was 53 angstroms/min.

Furthermore, contact holes pierce through a substrate 1 were formed on the resulting silica-based organic film 5 and the contact holes were filled with hydrofluoric acid having a concentration of 0.5% by weight. After a lapse of 10 minutes, a cross section of contact holes was observed. As a result, side etching was not observed even at the bottom of the contact holes.

Example 2

In the same manner as in Example 1, except for changing the amount of monomethyltrimethoxysilane to 102.15 g (0.75 mol), changing the amount of tetramethoxysilane to 38.05 g (0.25 mol), changing the amount of acetone to 47.60 g, changing the amount of isopropyl alcohol to 95.20 g and changing the amount of water to 117.0 g (6.5 mol) in Example 1, a coating solution containing organosiloxane having a weight-average molecular weight of 1600 in an amount of 15% by weight calculated on the basis of $SiO_2$ was obtained. The resulting coating solution was diluted to a proper concentration for control of a film thickness. The water content measured by gas chromatography with respect to the amount of the solvent excluding the solid content of the coating solution was 10% by weight.

In the same manner as in Example 1, except for changing the film thickness to 4200 angstroms, the evaluation was conducted. As a result, unevenness wherein the wiring distance D in an intermediate layer (SiN film) 3 is 0.20 μm was filled and no cracking occurred in the silica-based organic film 5 and the surface was smooth. Also in the case in which the wiring distance D is 0.05 μm, neither voids nor cracking occurred and the surface was smooth.

The carbon content in the resulting silica-based organic film 5 was calculated by the following formula (3) and the value was 13.8 atm %.

$$[3C/\{3(CH_3SiO_{3/2})+SiO_2\}] \times 100 \quad (3)$$

The organic group content of the silica-based organic film 5 obtained after baking was calculated from the infrared absorption spectrum (not shown). As a result, it was 0.038.

In the same manner as in Example 1, wet etching was conducted by dipping in hydrofluoric acid having a concentration of 0.5% by weight at 25° C. for 210 minutes. The etching rate at a film thickness of 3500 to 1100 angstroms was 40 angstroms/min.

In the same manner as in Example 1, side etching in contact holes was observed. As a result, side etching was not observed.

Example 3

In the same manner as in Example 1, except for changing the coating solution to inorganic SOG made of hydrogen silsesquioxane (HSQ) and baking in an atmospheric air at 800° C. for 30 minutes in Example 1, the evaluation was conducted. As a result, unevenness wherein the wiring distance is 0.20 μm in the intermediate layer (SiN film) 3 was free from voids and cracking was not observed and also the surface was smooth.

In the same manner as in Example 1, the etching rate to hydrofluoric acid having a concentration of 0.5% by weight was determined. As a result, it was 70 angstroms/min.

In the same manner as in Example 1, side etching in contact holes was observed. As a result, side etching was observed.

Example 4

In the same manner as in Example 1, except for baking in an atmospheric air (oxygen concentration of more than 1000 ppm) without supplying a nitrogen gas in Example 1, an organic group was decomposed during baking and a silica-based organic film was not formed.

Therefore, an organic group content was calculated from an infrared absorption spectrum (not shown) of the film obtained after baking. As a result, it was 0.

In the same manner as in Example 1, the evaluation was conducted. As a result, unevenness wherein the wiring distance D in an intermediate layer (SiN film) 3 is 0.20 μm was filled without forming voids, but cracking occurred.

In the same manner as in Example 1, the etching rate to hydrofluoric acid having a concentration of 0.5% by weight was determined. As a result, it was 150 angstroms/min.

In the same manner as in Example 1, side etching in contact holes was observed. As a result, side etching was observed.

(Thermal Desorption Spectral Analysis Test)

The silica-based organic film 5 obtained after baking in Example 1 was analyzed by thermal desorption spectroscopy (TDS). The results are shown in FIG. 3.

Figure 3:
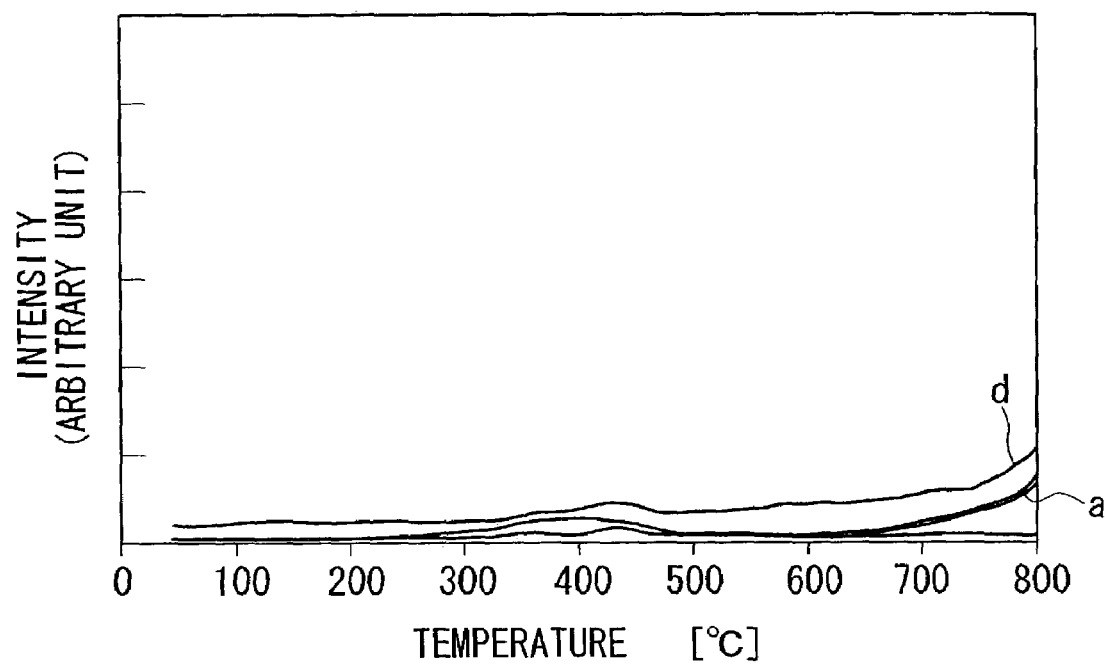
FIG. 3 is a graph showing the analytical results of a silica-based organic film obtained in Example 1 by thermal desorption spectroscopy.

FIG. 3 is a graph in which a, b, c and d respectively correspond to gasses $CH_3$, $H_2O$, $C_2H_4$ or CO, and $CO_2$.

As is apparent from the results of this graph, almost no degassing occurred at a temperature up to about 700° C. and less degassing occurred even at a temperature from 700 to 800° C. in the film obtained in Example 1.

What is claimed is:

1. A silica-based organic film obtained by a method comprising:
   applying a coating solution on a target material to form a coating film, the coating solution containing a reaction product obtained by hydrolyzing, in an organic solvent in the presence of an acid catalyst, at least one first alkoxysilane compound selected from the group consisting of compounds represented by general formula (I):

wherein $R^1$ represents an alkyl group having 1 to 4 carbon atoms or a phenyl group, and $R^2$ represents an alkyl group having 1 to 4 carbon atoms, and compounds represented by general formula (II):

wherein $R^3$ represents an alkyl group having 1 to 4 carbon atoms or a phenyl group, and $R^4$ represents an alkyl group having 1 to 4 carbon atoms, and
   baking the coating film in an atmosphere having an oxygen concentration of 1000 ppm or less, and at a temperature from 680° C. to 750° C. to form a film, wherein an etching rate of the silica-based organic film in wet etching using hydrofluoric acid having a concentration of 0.5% by weight at 25° C. is 60 angstroms/min or less, and wherein an organic group content, which is represented as a ratio of the total of a peak area of $SiR^1$ and a peak area of $SiR^3$ to a peak area of Si—O—Si in a spectrum obtained by measuring an infrared absorption spectrum of the film, is 0.01 or more.

2. The silica-based organic film according to claim 1, wherein a carbon content is from 6 to 18 atm %.

3. A silica-based organic film obtained by a method comprising:

applying a coating solution on a target material to form a coating film, the coating solution containing a reaction product obtained by hydrolyzing, in an organic solvent in the presence of an acid catalyst, at least one first alkoxysilane compound selected from the group consisting of compounds represented by general formula (I):

$$R^1{}_2Si(OR^2)_2 \quad (I)$$

wherein $R^1$ represents an alkyl group having 1 to 4 carbon atoms or a phenyl group, and $R^2$ represents an alkyl group having 1 to 4 carbon atoms, and compounds represented by general formula (I):

$$R^3Si(OR^4)_{3nm} \quad (II)$$

wherein $R^3$ represents an alkyl group having 1 to 4 carbon atoms or a phenyl group, and $R^4$ represents an alkyl group having 1 to 4 carbon atoms, and at least one second alkoxysilane compound selected front the group consisting of compounds represented by general formula (III):

$$Si(OR^5)_4 \quad (III)$$

wherein $R^5$ represents an alkyl group having 1 to 4 carbon atoms, and baking the coating film in an atmosphere having an oxygen concentration of 1000 ppm or less, and at a temperature from 680° C. to 750° C. to form a film, wherein an etching rate of the silica-based organic film in wet etching using hydrofluoric acid having a concentration of 0.5% by weight at 25° C. is 60 angstroms/min or less, and wherein an organic group content, which is represented as a ratio of the total of a peak area of $SiR^1$ and a peak area of $SiR^3$ to a peak area of Si—O—Si in a spectrum obtained by measuring an infrared absorption spectrum of the film, is 0.01 or more.

4. The silica-based organic film according to claim 3, wherein a carbon content is from 6 to 18 atm %.

* * * * *